(12) United States Patent
Low et al.

(10) Patent No.: US 6,677,814 B2
(45) Date of Patent: Jan. 13, 2004

(54) METHOD AND APPARATUS FOR FILTER TUNING

(75) Inventors: Eng Chuan Low, San Diego, CA (US); Jonathon Cheah, San Diego, CA (US); Shih-Tsung Yang, San Diego, CA (US); Christopher Yong Soon Fatt, San Diego, CA (US)

(73) Assignee: Microtune (San Diego), Inc., San Diego, CA (US)

( * ) Notice: Subject to any disclaimer, the term of this patent is extended or adjusted under 35 U.S.C. 154(b) by 0 days.

(21) Appl. No.: 10/051,416

(22) Filed: Jan. 17, 2002

(65) Prior Publication Data

US 2003/0132799 A1 Jul. 17, 2003

(51) Int. Cl.[7] .............................. H03B 1/00; H03K 5/00; H04B 1/10
(52) U.S. Cl. ..................... 327/554; 327/558; 327/337
(58) Field of Search ................................ 327/552, 553, 327/554, 558, 336, 337

(56) References Cited

U.S. PATENT DOCUMENTS

| | | | |
|---|---|---|---|
| 5,187,445 A | * | 2/1993 | Jackson ....................... 327/553 |
| 5,245,646 A | * | 9/1993 | Jackson et al. ................ 377/2 |
| 5,625,316 A | | 4/1997 | Chambers et al. .......... 327/553 |
| 5,914,633 A | * | 6/1999 | Comino et al. ............. 327/553 |

OTHER PUBLICATIONS

PCT Search Report for PCT/US 03/01302, 5 pages, Jun. 3, 2003.

\* cited by examiner

Primary Examiner—Terry D. Cunningham
Assistant Examiner—Quan Tra
(74) Attorney, Agent, or Firm—Baker Botts L.L.P.

(57) ABSTRACT

Tuning of a filter circuit is accomplished by determining a real RC time constant value for the filter circuit, then comparing the real RC vale to a predetermined RC value. If the real RC value does not match the predetermined RC value, the real RC value is varied (e.g. using a number of capacitors in a capacitor arr

13 Claims, 5 Drawing Sheets

US 6,677,814 B2

METHOD AND APPARATUS FOR FILTER TUNING

FIELD OF THE INVENTION

The present invention relates generally to the field of communications devices and, more specifically, to filter tuning.

BACKGROUND OF THE INVENTION

In many filter circuit designs, resistance and capacitance are basic, yet critical design elements. A filter circuit is designed to function with particular results based on definite resistance and capacitance values. However, when the filter circuit is included within an integrated chip (IC), slight fabrication errors cause variations in the values of the resistors and capacitors in the filter circuit. These variations can be as large as ±20% for resistors and ±15% for capacitors. Thus, with variations so large, the filter circuit may exhibit significant errors in the filter response. Consequently, to overcome the undesirable variations in resistors and capacitors, a tuning circuit is required.

BRIEF DESCRIPTION OF THE DRAWINGS

The present invention is illustrated by way of example and should not be limited by the figures of the accompanying drawings in which like references indicate similar elements and in which.

SUMMARY OF THE INVENTION

A method and apparatus for filter circuit tuning is described. In one embodiment the method includes determining a real RC time constant value for a filter circuit, then comparing the real RC value to a predetermined RC value. If the real RC value does not match the predetermined RC value, the method continues with varying the real RC value until it matches the predetermined RC value.

Other features of the present invention will be apparent from the accompanying drawings and from the detailed description that follows.

DETAILED DESCRIPTION OF THE INVENTION

Described herein is a method and apparatus for tuning a filter. In the following description numerous specific details are set forth in order to provide a thorough understanding of the present invention. One of ordinary skill in the art, however, will appreciate that these specific details are not necessary to practice the present invention. While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

Apparatus

Figure 1:
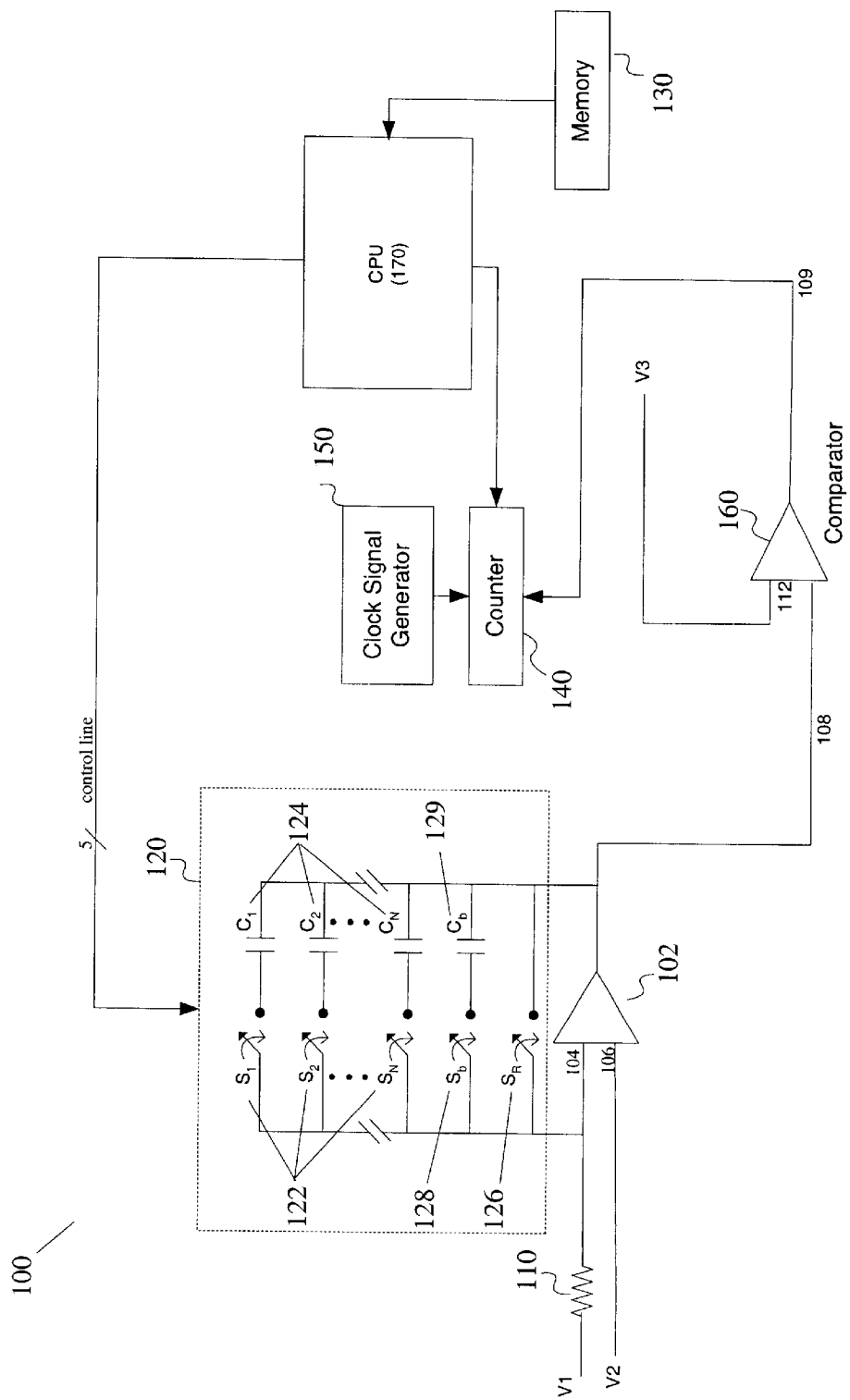
FIG. 1 is a diagram of one embodiment of a tuning circuit 100 configured according to the present invention.

FIG. 1 is a diagram of one embodiment of a tuning circuit 100 configured according to the present invention. Referring to FIG. 1, tuning circuit 100 includes an op-amp 102, a resistor 110, and a capacitor array 120. The op-amp 102 includes first and second inputs 104 and 106, and an output 108. The op-amp 102 may be any kind of op-amp known in the art. The resistor 110 has an arbitrary design value and is coupled to the first input 104 of the op-amp. In one embodiment, the resistor value is 265.08 k$\Omega$, however due to fabrication errors in the manufacturing process, a resistor's value may vary by as much as ±20% of the design value for current CMOS IC fabrication. The capacitor array 120 is coupled in a feedback path between the first input 104 and the op-amp output 108. The capacitor array 120 includes a plurality of capacitors 124 ($C_1$–$C_N$) connected in parallel to each other, each capacitor having a particular value, and each of the plurality of capacitors 124 having a corresponding switches 122 ($S_1$–$S_N$). In one embodiment, capacitor array 120 further has a base capacitor value $C_b$ 129, with an associated switch 128 ($S_b$).

The capacitance values of the plurality of capacitors 124 in the capacitor array 120 should be such that when switched together in combination, at least one combination of values will provide an optimal capacitance required by a filter circuit, thus producing a tuning effect that will tune the filter circuit as close as possible to a predetermined RC value. The predetermined RC value is arbitrary and is determined by the design rules of the circuit In one embodiment, the capacitor array 120 consists of 16 capacitors (including the base capacitor) with the following values:

| | | | |
|---|---|---|---|
| $C_b$ = 5.4529 pF | $C_1$ = 419.454 fF | $C_2$ = 419.454 fF | $C_3$ = 209.727 fF |
| $C_4$ = 209.727 fF | $C_5$ = 209.727 fF | $C_6$ = 209.727 fF | $C_7$ = 209.727 fF |
| $C_8$ = 209.727 fF | $C_9$ = 419.454 fF | $C_{10}$ = 419.454 fF | $C_{11}$ = 419.454 fF |
| $C_{12}$ = 419.454 fF | $C_{13}$ = 629.18 fF | $C_{14}$ = 629.18 fF | $C_{15}$ = 629.18 fF |

In one embodiment, one switch 126 ($S_R$) does not have a corresponding capacitor and creates a short circuit across the capacitor array when closed to initialize the capacitor array 120. When switch 126 is closed and switches 122 and 128 are closed, the plurality of capacitors 122 and 129 discharge, or reset. Thus switch 126 may also be referred to, herein, as a reset switch.

In one embodiment the tuning circuit 100 further includes a CPU 170, a clock signal generator 150, a memory 130, and a counter 140. The CPU 170 is used to control which switches are to be opened and closed. The clock signal generator 150 may be any kind of clock signal generator known in the art, such as a crystal oscillator, and is configured to produce a clock signal with a certain frequency. The frequency of the clock signal can be arbitrary, but may be determined by design rules. In one embodiment, the clock signal has a frequency of 24 MHz. The memory 130 is used to store the codes which the CPU 170 will execute.

The clock signal generator 150 produces a clock signal at a predetermined frequency (e.g., 24 MHz). The counter 140 is configured to determine the number of cycles of the clock signal that occur during a measurable time period corresponding to an RC time constant of the tuning circuit. The RC time constant of the tuning circuit is equivalent to the product of the resistance value of the resistor 110 and the capacitance value of the capacitor array 120. A method for determining a number of cycles, according to the present invention, is described in more detail in conjunction with FIG. 4 below.

The tuning circuit 100 further includes a comparator 160 which is configured to generate an output signal to the counter 140 so that the corresponding RC time constant of the tuning circuit can be measured. A method of measuring the RC time constant of the tuning circuit is explained in further detail in conjunction with FIG. 4 below.

The desired RC time constant is equivalently represented, in terms of the number of clock cycles, by a predetermined number stored in memory. The predetermined number may be determined by design rules and may be the equivalent of the clock signal generator frequency multiplied by the designed RC value for the filter circuit. In one embodiment, the predetermined RC time constant (i.e. designed RC value) is 2 μs. Exemplary embodiments of a method of utilizing the tuning circuit 100 will follow in further detail below.

Refer to the tuning circuit 100, when the tuning circuit 100 is in use, voltages $V_1$, $V_2$ and $V_3$ must be provided. The voltages provided to op-amp 102 and comparator 160 are denoted by $V_1$, $V_2$ and $V_3$ where $V_1 > V_2 > V_3$. The voltages $V_1$, $V_2$ and $V_3$ can be generated by using any state-of-art bias circuits.

Method

Figure 2:
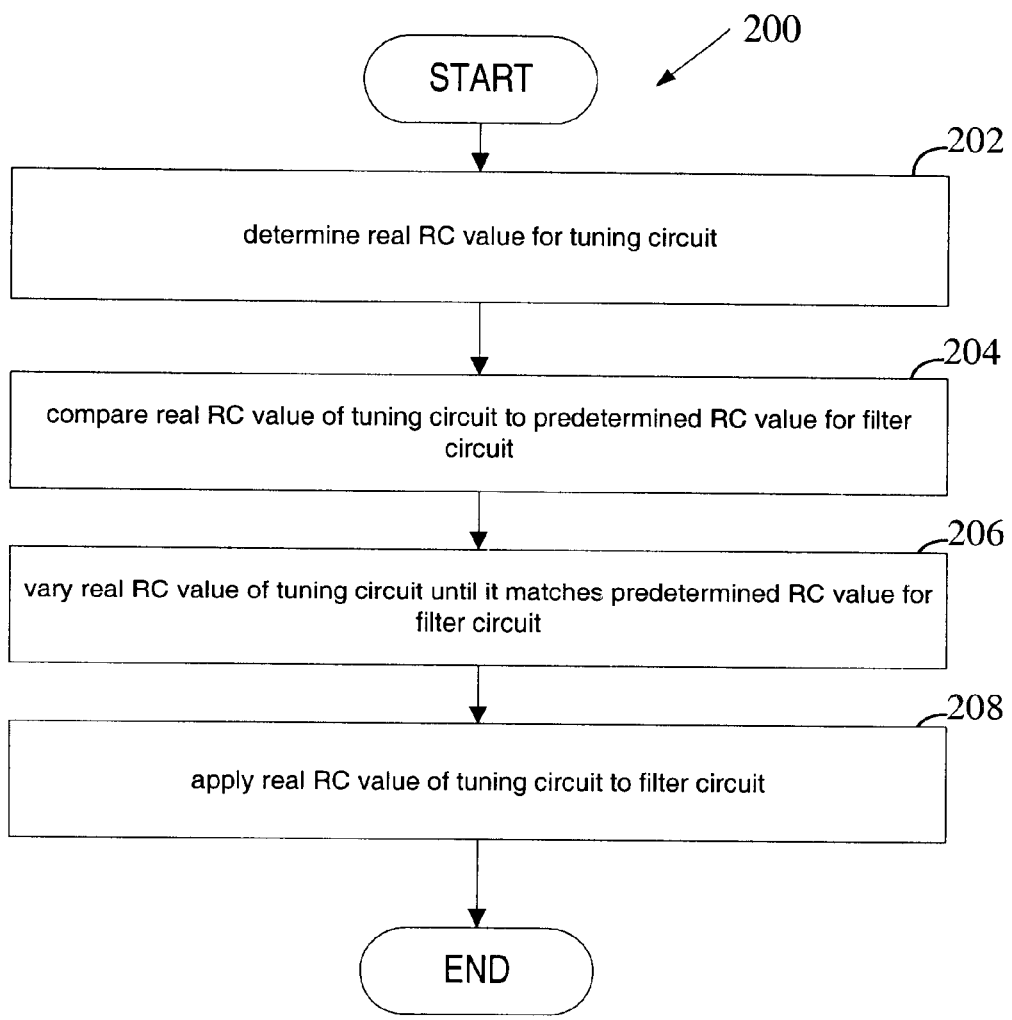
FIG. 2 is a flow diagram of one embodiment of a method 200 for tuning a filter circuit.

FIG. 2 is a flow diagram of one embodiment of a method 200 for tuning a filter circuit. Method 200 begins, at processing block 202, with determining a real RC time constant value (also referred to herein as an "RC value") for the tuning circuit. This is the actual RC value according to the circuit as fabricated, not merely as designed. Next, method 200 continues, at processing block 204, with comparing the real RC value to a predetermined RC value. The predetermined RC value is the designed value of the time constant. Finally, method 200 concludes, at processing block 206 by varying the real RC value (e.g., by opening and closing appropriate combinations of capacitor array switches 122) until the RC product equals, or closely approximates to within an acceptable error, the predetermined RC value. Method 200 may then continue, at processing block 208, with applying the real RC value of the tuning circuit to the filter circuit. A method of finding the appropriate the RC value is described in further detail below in conjunction with FIG. 3.

Figure 3:
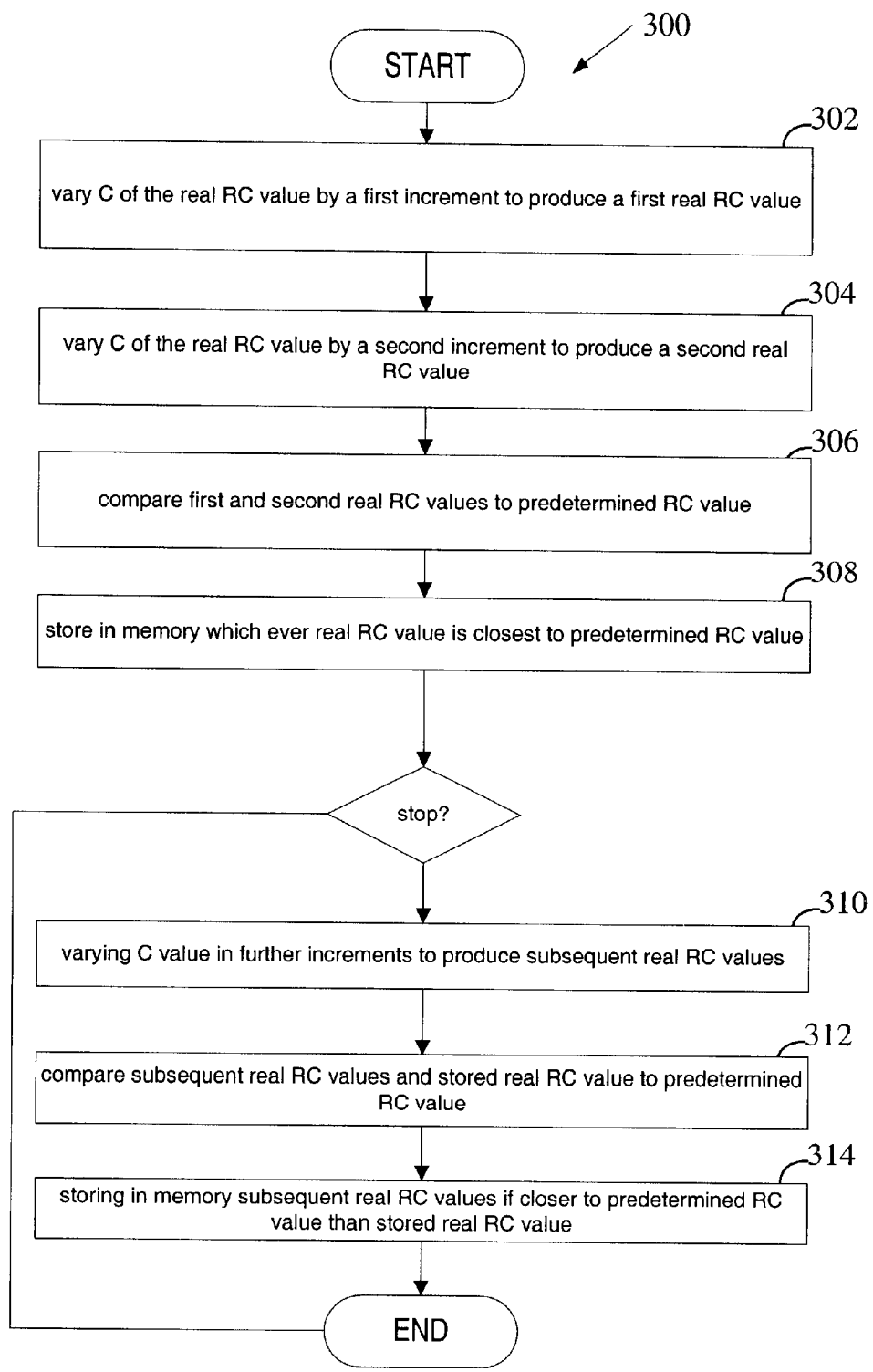
FIG. 3 is a flow diagram of one embodiment of a method 300 for varying a real RC value until it is closest to a predetermined RC value in a filter tuning circuit.

FIG. 3 is a flow diagram of one embodiment of a method 300 for varying a real RC value until it is closest to a predetermined RC value in a filter tuning circuit. Method 300 begins, at processing block 302, with varying the capacitance value (also referred to herein as "C value" or "C") of the real RC value by a first increment to produce a first real RC value. Method 300 continues, at processing block 304, with varying the C value by a second increment to produce a second real RC value. Method 300 then continues, at processing block 306, with comparing the first and second real RC values to the predetermined RC value. Method 300 concludes, at processing block 308, with storing in a memory which ever of the first or second real RC value is closest to the predetermined RC value.

In one embodiment, method 300 may further include, as shown in processing block 310, varying the C value in further increments to produce subsequent real RC values (fourth, fifth, and so on). Then, at processing block 312, method 300 may further include comparing the subsequent real RC values and the stored real RC value to the predetermined RC value. Finally, method 300 may further include, as shown in processing block 314, storing in memory the subsequent real RC values if closer to the predetermined RC value than the stored real RC value. In one embodiment, the real RC value may be incremented up to 16 times. These increments correspond to different open/closed combinations of capacitor array switches 122 and 128.

Figure 4:
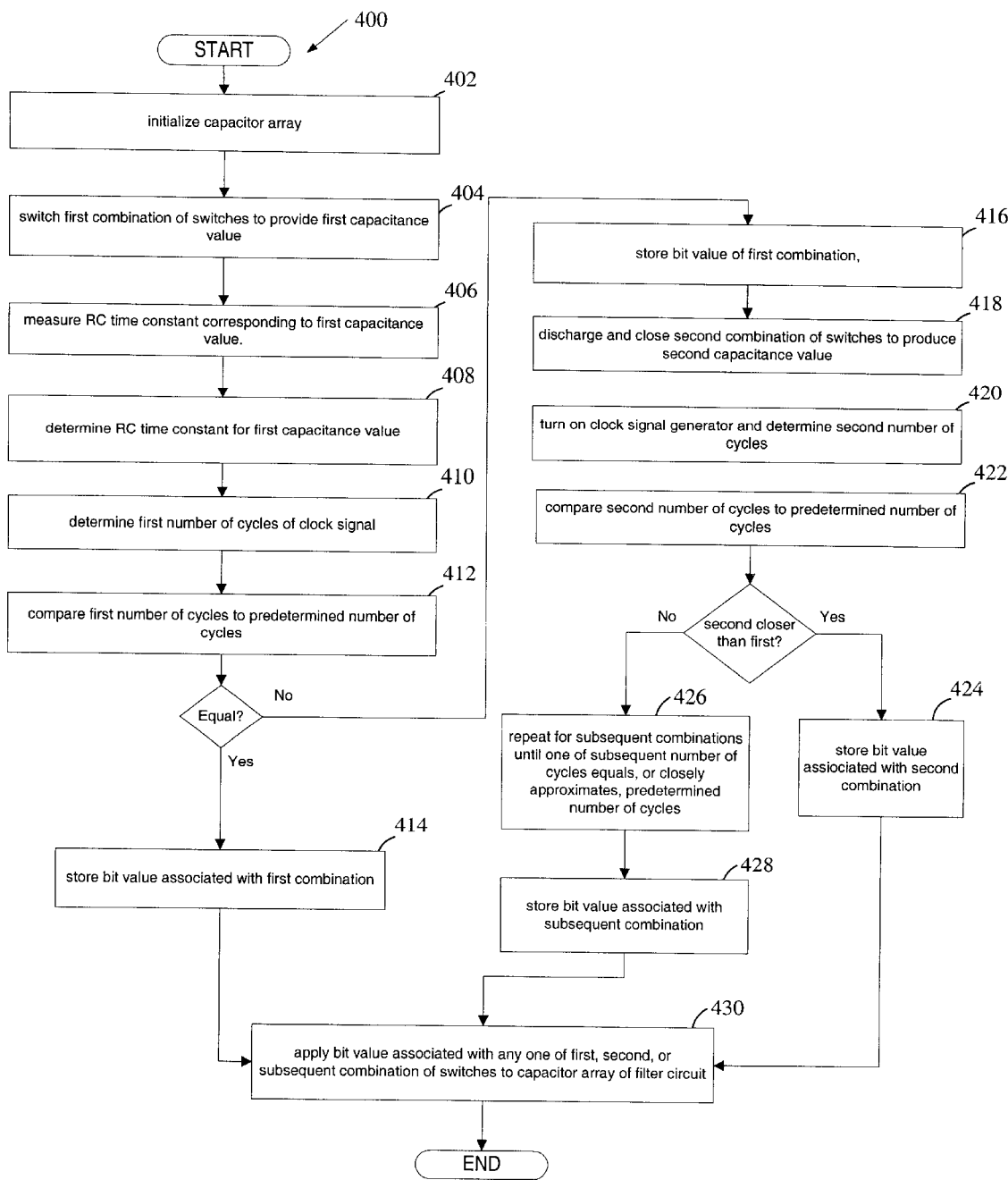
FIG. 4 is a flow diagram of one embodiment of a method 400 for tuning a filter circuit.

FIG. 4 is a flow diagram of one embodiment of a method 400 for tuning a filter circuit. Method 400 utilizes elements described in conjunction with tuning circuit 100 further above. Referring to FIG. 4, method 400 begins, at processing block 402, with initializing the capacitor array 120. Initializing the capacitor array 120 includes closing all the switches in the capacitor array 122 and 128, then closing the reset switch 126 to discharge the base capacitor 129 and the plurality of capacitors 124. In one embodiment, it is advantageous to wait at least one microsecond for the capacitors to discharge.

Then, method 400 continues, at processing block 404, with switching (closing and/or opening) a first combination of switches to provide a first capacitance in the capacitor array 120. The combination of switches can be determined by a computing algorithm stored in memory 130 and effectuated by CPU 170. In one example, a (4+1)-bit control line may be connected to the CPU 170 and configured to switch the capacitors in 16 different combinations (4 bits) as well as to control the reset switch (1 bit).

Figure 5:
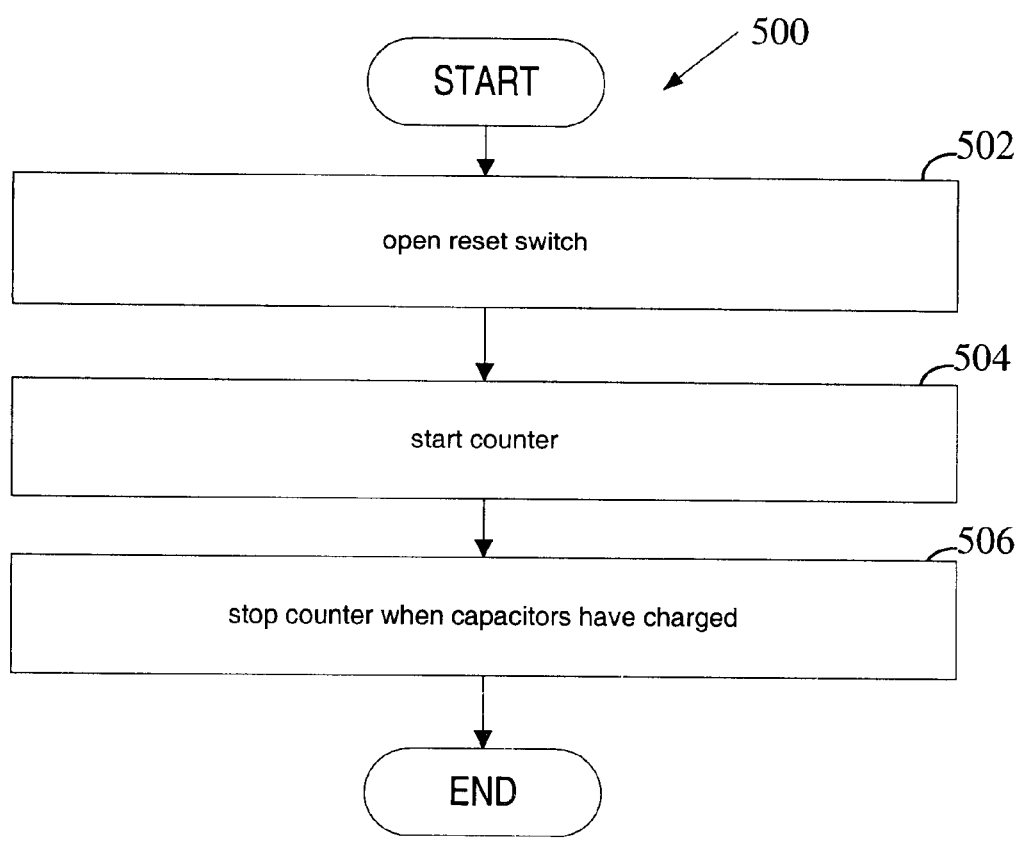
FIG. 5 is an exemplary embodiment of a method 500 of measuring an RC time constant.

Next, at processing block 406, method 400 continues with measuring the RC time constant corresponding to the first capacitance value. An exemplary method 500 of measuring the RC time follows, is shown in FIG. 5. First, in processing block 502, method 500 includes opening the reset switch immediately after, or simultaneously with, the switching of the first combination of switches. Then, method 500 continues, as shown in processing block 504, with starting the counter 140 immediately after, or simultaneously with, the opening of the reset switch. As time passes, the combination of switched capacitors in the capacitor array 120 will charge, causing output 108 to decrease as time passes. Method 500 may then continue, as shown at processing block 506, by stopping the counter 140 once the capacitors in the capacitor array 120 have charged. In one embodiment, the time it takes for the capacitor combination to charge corresponds to the RC time constant of the capacitor combination. Hence, the comparator 160 can be configured to so that the voltage signal ($V_3$) received at the first comparator input 112 is at a low level thus causing the output 109 of the comparator 160 to go high when the output of the op-amp 108 drops below the other comparator input voltage signal ($V_3$). Thus, once the comparator output signal 109 goes high, the counter 140 will stop counting. The counter 140 then has stored in it the number of clock cycles that cycled during the charging of the first combination of switched capacitors. This number of clock cycles represents the measurable time period it takes for the first combination of switched capacitors to reach their real RC time constant value.

Next, at processing block 408, method 400 continues with determining an RC time constant for the first capacitance value. The RC time constant is determined by the multiplying the value of the resistor 110, the capacitance value of the capacitor array 120 for any given capacitor combination, and the design value $(V_2-V_3)/(V_1-V_2)$. For example, in one embodiment, capacitor array 120 may have 16 different capacitors (i.e. $C_b$ and $C_1$–$C_{15}$). A (4+1)-bit control line may also be used to switch the capacitors in 16 different combinations (4 bits) as well as to control the reset switch (1 bit). One exemplary combination would be, for instance, when capacitor array switches $S_b$, $S_1$, $S_2$ and $S_3$ are switched on (which corresponding to the case of 4 bit control signal equal to 3). The corresponding RC time constant value would be the real resistance value (e.g. 265.08 kΩ±manufacturing error ) multiplied by the sum of $C_b$ (e.g. 5.4529 pF±manufacturing error), $C_1$ (e.g. 419.454 fF±manufacturing error), $C_2$ (e.g. 419.454 fF±manufacturing error), and $C_3$ (e.g. 209.727 fF±manufacturing error), times the value $(V_2-V_3)/(V_1-V_2)$ (e.g., 1) or:

$$\begin{aligned} RC \text{ time constant}_{first} &= R_{real} \times C_{real\_first\ capacitance\ value}(V_2 - V_3)/(V_1 - V_2) = \\ &= R_{real} \times (C_b + C_1 + C_2 + C_3) \times (V_2 - V_3)/(V_1 - V_2) \\ &= \frac{265.08\ k\Omega \times (5.4529\ pF + 419.454\ fF + 419.454\ fF + 209.727\ fF) \pm \text{manufacturing error} \times (1)}{} \\ &= 1.723\ \mu s + 5\%(\text{manufacturing error}) \\ &\cong 1.809\ \mu s \end{aligned}$$

The first RC time constant has a measurable time period (e.g. 1.809 μs).

Next, method 400 continues, at processing block 410, with determining a first number of cycles of a clock signal. The clock signal generator 150 produces the clock signal at a particular frequency (e.g. 24 MHz). The number of cycles is computed by multiplying the frequency of the clock signal generator 150 (e.g. 24 MHz) by the measurable time period of the first RC time constant (e.g. 1.809 μs), or:

$$\begin{aligned} \text{number of cycles}_{first} &= (RC \text{ time constant}_{first}) \times \text{clock signal generator frequency}) \\ &= (18.09\ \mu s) \times (24\ MHz) \\ &= 43 \equiv \text{a value Y representing the number of cycles} \end{aligned}$$

Because the first RC time constant is measured in seconds and the clock signal generator frequency is measured in 1/seconds, the number of cycles is a scalar value.

Consequently, method 400 continues, at processing step 412, with comparing the first number of cycles (e.g., Y×24 MHz, or 43) to a predetermined number of cycles. The predetermined number of cycles is determined by multiplying the clock signal generator frequency by a predetermined measurable time period corresponding to a predetermined RC value (e.g., 24 MHz×2 μs=48). The predetermined RC value is the designed RC value for a filter circuit. The predetermined number of cycles also results in a scalar value and may be stored in memory 130. Thus, in one embodiment, the scalar value of the first number of cycles can be compared to the scalar value of the predetermined number of cycles using a computing algorithm (e.g., is Y×24 MHz=2 μs×24 MHz?). In another embodiment, the scalar values may each be stored in registers and compared to each other using hardware logic.

After the first number of cycles is compared to the predetermined number of cycles, method 400 may continue in various ways depending on the outcome.

In one embodiment, if the first number of cycles is equal to the predetermined number (e.g., Y×24 MHz=2 μs×24 MHz), then method 400 may continue, at processing block 414, with storing the bit value associated with the first combination and ending the process (e.g., storing the bit value of the control line that corresponds to the combination of switched switches $S_b$, $S_1$, $S_2$ and $S_3$).

If, however, the first number of cycles is not equal to the predetermined number of cycles (e.g., Y×24 MHz≠2 μs×24 MHz), method 400 may continue, as shown in processing blocks 416–422 with (1) storing the bit value of the first combination, (2) closing a second combination of switches to produce a second capacitance value, (3) turning on the clock signal generator and determining a second number of cycles, and (4) comparing the second number of cycles to the predetermined number of cycles.

In one embodiment, the CPU 170 may intelligently compare how close the first number of cycles was to the predetermined number of cycles and accordingly compute a second combination that will attempt to bring the second number of cycles closer to the predetermined number of cycles than the first. For instance, if the first number of cycles is 43, as shown in the example above, and the predetermined number of cycles is 48, then the CPU 170 can determine that 43 is lower than 48 and thus determine that the capacitance value of the capacitor array 120 must increase (i.e., switch on more capacitors, or switch off lower valued capacitors and switch on higher valued capacitors.)

Then, if the second number of cycles is closer to the predetermined number of cycles than the first number of cycles, method 400 may continue, at processing block 424, with storing the bit value associated with the second combination. If, however, the second number of cycles is not closer to the predetermined number of cycles than the first number of cycles, then method 400 may continue, as shown in processing block 426, with repeating for subsequent combinations until one of the subsequent combinations of capacitance values produces a number of cycles equal to the predetermined number of cycles. In one embodiment, repeating may occur for a limited number of combinations until a subsequent value of clock cycles closely approximates the predetermined number of cycles (e.g., within an acceptable error tolerance). Then, at processing block 428, method 400 continues with storing the bit value of the subsequent combination associated with the subsequent number of cycles equal to, or most approximately equal to, the predetermined number of cycles.

Consequently, a filter circuit may have an RC filter design with a capacitor array similar to that of the tuning circuit. Method 400, therefore, may continue, as shown in processing block 430, with applying the bit value associated with any one of the first, second, or subsequent combination of switches to a capacitor array of a filter circuit. In one embodiment, the filter circuit may have a similar capacitor array and resistor as those of the tuning circuit, thus the RC value can be applied to the filter circuit by switching the capacitors in the capacitor array of the filter circuit to have the same switched configuration as the capacitors in the capacitor array of the tuning circuit. Hence, the filter circuit will have an RC response equal to, or very close to, that of the filter circuit, which should approximate that of the designed RC response.

Thus a method and apparatus for filtering a tuning circuit has been described. The scope of the present invention should only be measured by the claims, which follow.

What is claimed:

1. A method, comprising:

determining a real RC value for a tuning circuit;

varying a component of the real RC value by a first increment to produce a first real RC value;

varying the component by a second increment to produce a second real RC value;

comparing the first and second real RC values to a predetermined RC value of a filter circuit; and storing in a memory which ever of the first and second real RC values is closest to the predetermined RC value.

2. The method of claim 1, further comprising:

varying the component in further increments to produce subsequent real RC values;

comparing each of the subsequent real RC values and a stored real RC value to the predetermined RC value; and storing in memory one or more of the subsequent real RC values if they are closer to the predetermined RC value than the stored real RC value.

3. The method of claim 1, wherein the component of the real RC value is incremented up to sixteen times.

4. The method of claim 1 further comprising:

applying the stored RC value to the filter circuit.

5. A method comprising:

determining a real RC time constant for a circuit;

multiplying the real RC time constant by a clock frequency to determine a first real scalar value;

varying the real RC time constant to produce a varied real RC time constant and multiplying the varied real RC time constant by the clock frequency to determine a second scalar value;

comparing the first and second scalar values to a predetermined scalar value, said predetermined scalar value defined as the product of a predetermined RC time constant and the clock frequency; and storing in memory the first or second real scalar value that is closest to the predetermined scalar value.

6. The method of claim 5 further comprising:

varying the real RC time constant incrementally to determine subsequent real scalar values;

comparing each of the subsequent real scalar values to the predetermined scalar value;

comparing a stored scalar value to the predetermined scalar value; and storing in memory either one or more of the subsequent scalar values according to whether, for each of the subsequent real scalar values the subsequent real scalar value or the stored scalar value is closest in value to the predetermined scalar value.

7. The method of claim 5 wherein the real RC time constant is varied up to 16 times to produce 16 real scalar values.

8. A method, comprising:

(1) initializing a capacitor array of a tuning circuit, said tuning circuit including the capacitor array, a clock signal generator, and a counter, said capacitor array including a plurality of capacitors with corresponding capacitance values, said plurality of capacitors having corresponding switches coupled to switch the capacitors on and off, and said capacitor array also including a reset switch;

(2) switching a first combination of the switches to on and off positions to provide a first capacitance in the capacitor array;

(3) measuring a first RC time constant corresponding to the first capacitance value, said first RC time constant having a measurable time period;

(4) determining a first number of clock cycles, said first number of clock cycles being equal to the product of the measurable time period of the first RC time constant and a frequency of clock cycles generated by the clock signal generator; and (6) comparing the first number of clock cycles to a predetermined number of clock cycles, said predetermined number of clock cycles determined by multiplying the clock signal generator frequency by a predetermined measurable time period corresponding to a predetermined RC time constant;

if the first number of cycles is not equal to the predetermined number of cycles:

storing a bit value associated with the first combination of switches in memory;

closing a second combination of the switches to produce a second capacitance value;

using the clock signal generator to produce a second number of cycles;

comparing the second number of cycles to the predetermined number of cycles; and (a) if the second number of cycles is closer to the predetermined number of cycles than the first number or cycles:

(i) replacing the bit value associated with the first combination of the switches with a bit value associated with the second combination of switches; otherwise (b) if the second number of cycles is not closer to the predetermined number of cycles than was the first number of cycles:

(i) repeating the comparing, for subsequent combinations of the switches, until one of the subsequent combinations of switches has an associated number of cycles equal to, or approximately equal to, the predetermined number of cycles; and (ii) replacing the bit value associated with the second combination of the switches with a bit value associated with the subsequent combination of switches that has an associated number of cycles equal to, or approximately equal to, the predetermined number of cycles.

9. The method of claim 8, wherein initializing the capacitor array comprises:

closing all the switches in the capacitor array corresponding to the plurality of capacitors; and closing the reset switch to discharge the plurality of capacitors.

10. The method of claim 8, wherein measuring a first RC time constant corresponding to the first capacitance value of the circuit comprises:

switching the capacitors in the capacitor array into the first combination of on and off positions;

opening the reset switch; and starting the counter, said counter coupled to the output of the op-amp and configured to measure the first number of clock cycles generated by the clock signal generator during the measurable time period of the first RC time constant.

11. The method of claim 8 further comprising:

applying the bit value associated with any one of the first, second, or subsequent combination of switches to a capacitor array of a filter circuit.

12. A tuning circuit, comprising:

an op-amp with first and second inputs and an output, said first input configured to receive a first voltage signal, said second input configured to receive a second voltage signal, and said output to produce a third voltage signal;

a resistor coupled to the first input of the op-amp, said resistor having a resistor value;

a capacitor array coupled in a feedback path between the first input of the op-amp and the output of the op-amp, said capacitor array including a plurality of capacitors coupled to a plurality of switches configured to be switched on and off in combinations, providing varied combinations of capacitor values that correspond to varied real RC values for the tuning circuit;

a comparator with a first input coupled to the output of the op-amp to receive the third voltage signal, a second input coupled to receive a fourth voltage signal, and an output coupled to a counter, said comparator configured to generate a fifth voltage signal through the output and provide the fifth voltage signal to the counter to control the counter as the counter counts clock cycles of a clock frequency for measurable time periods associated with the varied real RC values for the tuning circuit;

a CPU coupled to the capacitor array and configured to switch on and off the capacitors in the capacitor array in order to vary a component of a real RC value by a first increment to produce a first real RC value and to vary the component by a second increment to produce a second real RC value; and a memory coupled to the CPU and configured to store a bit value corresponding to which ever of the first and second real RC values is closest to a predetermined RC value of a filter circuit.

13. The tuning circuit of claim 12 further comprising a clock signal generator coupled to the counter and configured to provide a clock signal with a predetermined frequency.

* * * * *